(12) United States Patent
Hu et al.

(10) Patent No.: US 8,683,396 B2
(45) Date of Patent: Mar. 25, 2014

(54) DETERMINING SOURCE PATTERNS FOR USE IN PHOTOLITHOGRAPHY

(75) Inventors: Changquing Hu, Sunnyvale, CA (US); Linyong Pang, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 546 days.

(21) Appl. No.: 12/507,336

(22) Filed: Jul. 22, 2009

(65) Prior Publication Data
US 2011/0022994 A1 Jan. 27, 2011

(51) Int. Cl.
*G06F 17/50* (2006.01)
(52) U.S. Cl.
USPC .......................................................... 716/55
(58) Field of Classification Search
USPC ........... 716/55; 355/53, 55, 67; 430/5, 20, 22, 430/311
See application file for complete search history.

(56) References Cited

U.S. PATENT DOCUMENTS

| | | | |
|---|---|---|---|
| 6,563,566 B2 | 5/2003 | Rosenbluth et al. | |
| 6,709,792 B2 | 3/2004 | Nako | |
| 7,107,573 B2 | 9/2006 | Yamazoe et al. | |
| 7,124,394 B1 | 10/2006 | Abrams et al. | |
| 7,178,127 B2 | 2/2007 | Abrams et al. | |
| 7,384,710 B2 | 6/2008 | Ogawa et al. | |
| 7,441,227 B2 | 10/2008 | Abrams et al. | |
| 7,480,889 B2 | 1/2009 | Abrams et al. | |
| 7,571,423 B2 | 8/2009 | Abrams et al. | |
| 7,698,665 B2 | 4/2010 | Abrams et al. | |
| 7,703,068 B2 * | 4/2010 | Abrams et al. | 716/54 |
| 7,707,541 B2 * | 4/2010 | Abrams et al. | 716/50 |
| 7,757,201 B2 | 7/2010 | Abrams et al. | |
| 7,984,391 B2 | 7/2011 | Abrams et al. | |
| 7,992,109 B2 | 8/2011 | Abrams et al. | |
| 8,056,021 B2 | 11/2011 | Abrams et al. | |
| 2004/0265707 A1 | 12/2004 | Socha | |
| 2005/0168498 A1 | 8/2005 | Granik | |
| 2007/0184357 A1* | 8/2007 | Abrams et al. | 430/5 |
| 2007/0198963 A1 | 8/2007 | Granik et al. | |
| 2008/0198350 A1* | 8/2008 | Sugita et al. | 355/46 |

FOREIGN PATENT DOCUMENTS

| | | |
|---|---|---|
| WO | WO 2005/078528 A2 | 8/2005 |
| WO | WO 2005/078528 A3 | 8/2005 |
| WO | WO 2011/011112 A1 | 1/2011 |

OTHER PUBLICATIONS

Rosenbluth, A. E., et al., "Optimum mask and source patterns to print a given shape," $JM^31(a)$ (Apr. 13-30, 2002), 2002 Society of Photo-Optical Instrumentation Engineers.

(Continued)

*Primary Examiner* — Vuthe Siek
(74) *Attorney, Agent, or Firm* — Fenwick & West LLP

(57) ABSTRACT

Embodiments of a computer system, a process, a computer-program product (i.e., software), and a data structure or a file for use with the computer system are described. These embodiments may be used to determine or generate source patterns that define illumination patterns on photo-masks during a photolithographic process. Moreover, a given source pattern may be determined concurrently with an associated mask pattern (to which a given photo-mask corresponds) or sequentially (i.e., either the given source pattern may be determined before the associated mask pattern or vice versa.). During the determining, the given source pattern may be represented using one or more level-set functions. Additionally, the source pattern may be determined using an Inverse Lithography (ILT) calculation.

25 Claims, 11 Drawing Sheets

(56) References Cited

OTHER PUBLICATIONS

Pang, L., et al. "Full Chip Scale Source Mask Optimization (SMO) Implemented through Level Set Methods based Inverse Lithography Technology (ILT) Framework," Luminescent Litho Workshop 2009 Abstract, Apr. 29, 2009 vJM1.

Xiao et al., "Source Optimization and Mask Design to Minimize MEEF in Low $k_1$ Lithography" SPIE, vol. 7028, 11 pgs., (Jun. 9, 2008).

Pang et al., "Considering MEEF in Inverse Lithography Technology (ILT) and Source Mask Optimization (SMO)" SPIE, vol. 7122, 14 pgs., (Oct. 17, 2008).

PCT International Search Report and Written Opinion, PCT Application No. PCT/US2010/036476, Jul. 30, 2010, 7 pages.

* cited by examiner

```
┌─────────────────────────────────────────────────────────────┐
│  DETERMINE A FIRST FUNCTION CORRESPONDING TO A FIRST SOURCE │
│  PATTERN, WHERE A CARDINALITY OF THE FIRST FUNCTION IS      │
│  GREATER THAN A NUMBER OF DISTINCT TYPES OF REGIONS IN THE  │
│  SOURCE PATTERN, AND WHERE THE DOMAIN OF THE FIRST FUNCTION │
│  CORRESPONDS TO A FIRST PLANE OF THE FIRST SOURCE PATTERN   │
│                           210                               │
└─────────────────────────────────────────────────────────────┘
                              │
                              ▼
┌─────────────────────────────────────────────────────────────┐
│  GENERATE A SECOND FUNCTION BASED, AT LEAST IN PART, ON THE │
│  FIRST FUNCTION, WHERE THE SECOND FUNCTION CORRESPONDS TO A │
│                    SECOND SOURCE PATTERN                    │
│                           212                               │
└─────────────────────────────────────────────────────────────┘
```

FIG. 2A

```
┌─────────────────────────────────────────────────────────────┐
│  DETERMINE A THIRD FUNCTION CORRESPONDING TO THE FIRST      │
│                       SOURCE PATTERN                        │
│                           260                               │
└─────────────────────────────────────────────────────────────┘
                              │
                              ▼
┌─────────────────────────────────────────────────────────────┐
│  GENERATE A FOURTH FUNCTION BASED ON THE GRADIENT OF A COST │
│  FUNCTION, WHERE THE FOURTH FUNCTION CORRESPONDS TO THE     │
│  SECOND SOURCE PATTERN, AND WHEREIN THE COST FUNCTION       │
│  CORRESPONDS TO THE FIRST FUNCTION                          │
│                           262                               │
└─────────────────────────────────────────────────────────────┘
```

FIG. 2B

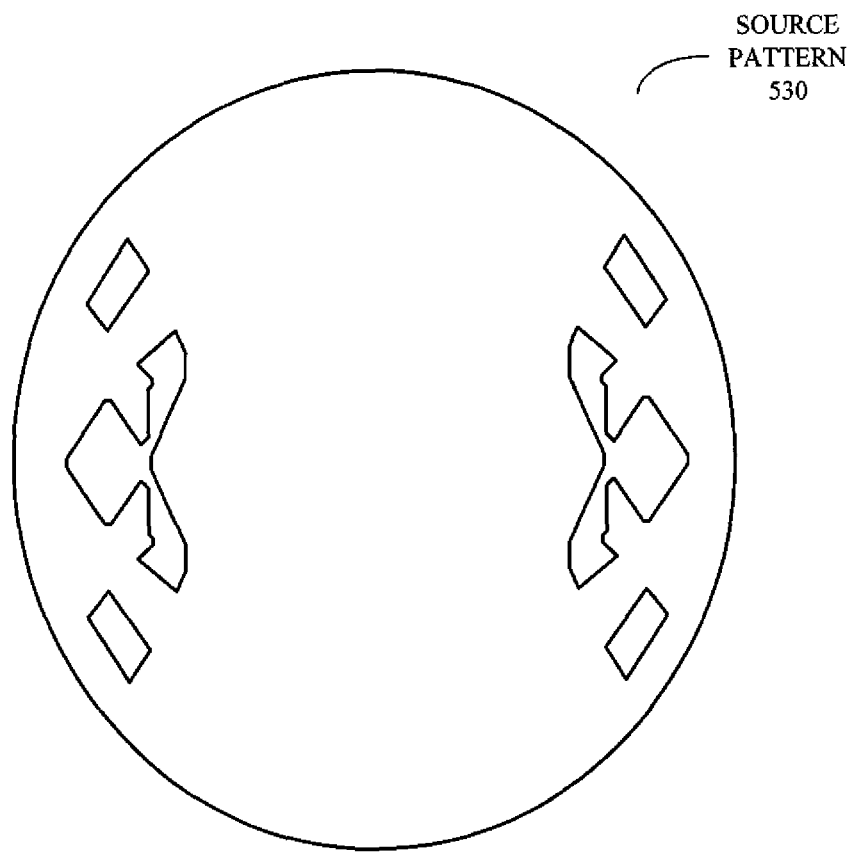
FIG. 5G
FIG. 5H

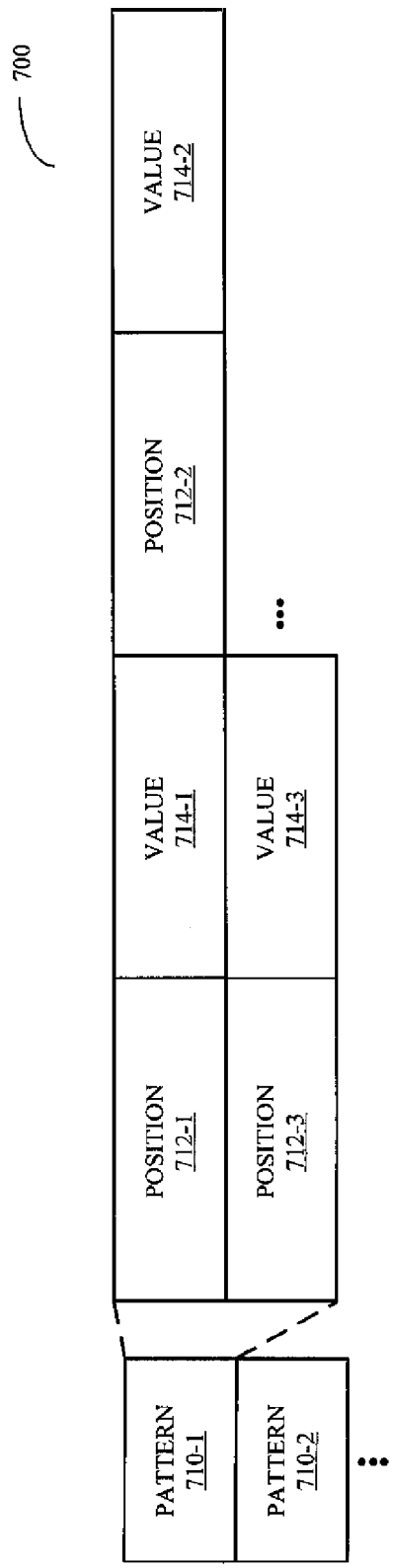

DETERMINING SOURCE PATTERNS FOR USE IN PHOTOLITHOGRAPHY

BACKGROUND OF THE INVENTION

1. Field of the Invention

The present invention relates to systems and techniques for determining source patterns that illuminate photo-masks during photo-lithography.

2. Related Art

Lithography processing represents an essential technology for manufacturing Integrated Circuits (IC) and Micro-Electro-Mechanical Systems (MEMS) and Nano-Electro-Mechanical Systems (NEMS). Lithographic techniques are used to define patterns, which include geometries, features, shapes, etc., onto an integrated-circuit die, semiconductor wafer, or chips. These patterns are typically defined by: a set of contours, lines, boundaries, edges, curves, etc., which generally surround, enclose, and/or define the boundary of the various regions which constitute the patterns.

One existing lithographic technique is photolithography, in which images defined by photo-masks are printed onto an integrated-circuit die or one or more semiconductor wafers. Furthermore, another existing lithographic technique is maskless lithography, in which a write device directly prints a write pattern onto the integrated-circuit die or the one or more semiconductor wafers, thereby eliminating the need for photo-masks. Unfortunately, it is increasingly difficult to determine the write patterns, or to design and manufacture photo-masks.

In particular, demand for increased density of features on the integrated-circuit die and the one or more semiconductor wafers has resulted in the design of circuits with decreasing minimum dimensions. These trends have significantly increased the complexity of the computations necessary to determine the write patterns and/or the mask patterns (to which the photo-masks correspond), with a commensurate impact on computation time, processing requirements, and expense.

Furthermore, due to the wave nature of light, as dimensions approach sizes comparable to the wavelength of the light used in the photolithography processes, the resulting wafer patterns deviate from the corresponding photo-mask patterns and are accompanied by unwanted distortions and artifacts. Existing techniques (such as Optical Proximity Correction or OPC, and resolution enhancement technologies or RET) are used to pre-distort the mask patterns to improve resolution and/or a process window (e.g., a range of process conditions that result in acceptable yield) in a photolithography process. While these techniques may ensure that the wafer pattern is printed more accurately, determining the pre-distorted mask patterns is increasingly difficult, thereby exacerbating the computational complexity and the associated problems.

Recently, researchers have investigated additional design degrees of freedom that may allow these design challenges to be reduced or eliminated for a given wavelength of light, thereby facilitating an increase in the resolution (or a decrease the critical dimension) and/or improved process control. For example, the problem can be expanded to include the design of additional components or adding more complexity to the existing components in a lithographic system, as opposed to focusing solely on the write pattern or the mask pattern. However, using many existing techniques, this effort has been confounded by the computational complexity of the problem.

Hence, what is needed is a technique that facilitates the printing of images on integrated-circuit dies or semiconductor wafers without the above-described problems.

SUMMARY OF THE INVENTION

One embodiment of the present invention provides a method for determining a source pattern to illuminate a photo-mask during a photolithographic process, which may be performed by a computer system. During operation, the computer system determines a first function corresponding to a first source pattern, where a cardinality of the first function is greater than a number of distinct types of regions in the source pattern, and where the domain of the first function corresponds to a first plane of the first source pattern. Then, the computer system generates a second function based, at least in part, on the first function, where the second function corresponds to a second source pattern.

In some embodiments, the number of distinct types of regions of the fist source pattern is 2. However, in some embodiments the number of distinct types of regions of the fist source pattern is greater than 2. For example, the distinct types of regions of the fist source pattern may include at least one translucent region.

In some embodiments, the distinct types of regions of the first source pattern include at least one polarized region.

In some embodiments, the first function includes a level-set function.

In some embodiments, the first function is a distance function in which a value of the first function corresponds to a distance from a nearest contour in the first plane of the first source pattern, where the nearest contour separates a first distinct type of region in the source pattern from a second distinct type of region in the source pattern.

In some embodiments, the generating involves determining a gradient of a cost function. For example, the gradient may correspond to a Frechet derivative of the cost function and/or the gradient may be a closed-form expression. However, in some embodiments the gradient is determined without calculating the cost function.

Note that the cost function may correspond to a difference of a target pattern and an aerial image at an image plane of an optical system in the photolithographic process, where the aerial image is associated with the first source pattern and a mask pattern corresponding to the photo-mask. For example, the cost function may include a 2-norm of the difference.

Moreover, the target pattern may correspond to a circuit pattern that is to be printed at the image plane. In some embodiments, the target pattern is a distorted version of the circuit pattern. For example, the distortion may involve convolving a Gaussian function with the circuit pattern.

In some embodiments, the computer system calculates the second source pattern by evaluating the second function in a second plane, which can be the first plane or a different plane.

In some embodiments, the computer system determines a mask pattern corresponding to the photo-mask concurrently with determining of the source pattern. However, in some embodiments the computer system determines a mask pattern corresponding to the photo-mask separately from determining of the source pattern.

In some embodiments, the second source pattern improves a process window during the photolithographic process relative to that of the first source pattern.

In some embodiments, the computer system determines the first source pattern on a pixel-by-pixel basis based at least on metrics associated with the photolithographic process prior to determining the first function. For example, a given metric may include a contrast of a gradient of an aerial image at an image plane of an optical system in the photolithographic process, where the aerial image is associated with a given pixel in the first source pattern and a mask pattern corresponding to the photo-mask. Moreover, determining the first source pattern may involve comparing the metrics with a predetermined threshold, where a given pixel has a finite transmittance if the given metric associated with the given pixel exceeds the predetermined threshold. Additionally, in some embodiments the computer system refines the determined first source pattern based at least on interactions between pixels.

Another embodiment provides a computer-program product for use in conjunction with the computer system, which includes instructions corresponding to at least some of the operations in the method.

Another embodiment provides the computer system to perform the operations in the method.

Another embodiment provides a semiconductor wafer produced in the photolithographic process.

Another embodiment provides a data file, stored in a computer-readable memory, which includes information corresponding to the source pattern.

Another embodiment provides another method for determining another source pattern to illuminate a photo-mask during another photolithographic process, which may be performed by a computer system. During operation, the computer system determines a third function corresponding to the first source pattern. Then, the computer system generates a fourth function based at least on the gradient of a cost function, where the fourth function corresponds to the second source pattern, and where the cost function corresponds to the first function.

In some embodiments, the third function is the first function and the fourth function is the second function.

Another embodiment provides a computer-program product for use in conjunction with the computer system, which includes instructions corresponding to at least some of the operations in the other method.

Another embodiment provides the computer system to perform the operations in the other method.

Another embodiment provides another semiconductor wafer produced in the other photolithographic process.

Another embodiment provides another data file, stored in a computer-readable memory, which includes information corresponding to the other source pattern.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 2A is a flow chart illustrating a process for determining a source pattern to illuminate a photo-mask during a photolithographic process in accordance with an embodiment of the present invention.

FIG. 2B is a flow chart illustrating a process for determining a source pattern to illuminate a photo-mask during a photolithographic process in accordance with an embodiment of the present invention.

FIG. 5G is a drawing illustrating a source pattern in accordance with an embodiment of the present invention.

FIG. 5H is a drawing illustrating a target pattern in accordance with an embodiment of the present invention.

FIG. 7 is a block diagram illustrating a data structure in accordance with an embodiment of the present invention.

Note that like reference numerals refer to corresponding parts throughout the drawings.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a process, a computer-program product (i.e., software), and a data structure or a file for use with the computer system are described. These embodiments may be used to determine or generate source patterns that define illumination patterns on photo-masks during a photolithographic process. Moreover, a given source pattern may be determined concurrently with an associated mask pattern (to which a given photo-mask corresponds) or sequentially (i.e., either the given source pattern may be determined before the associated mask pattern or vice versa.). During the determining, the given source pattern may be represented using one or more level-set functions. Additionally, the source pattern may be determined using an Inverse Lithography (ILT) calculation.

The additional design degrees of freedom provided by the source pattern may facilitate: photolithographic processes with increased resolution (or a decreased critical dimension) for a given wavelength of light and a given optical path (such as a photolithographic process in which an effective k1 is less than 0.3); more accurate fabrication of target patterns (such as reduced tolerances for a circuit pattern) on semiconductor wafers or semiconductor dies (i.e., reduced photolithographic errors); increased process margins (such as a depth of focus and/or a mask error enhancement factor); and/or improved photo-mask manufacturability. In combination with each other or independently, these features may increase semiconductor-wafer and/or photo-mask yields, with a commensurate impact on associated costs.

Figure 1A:
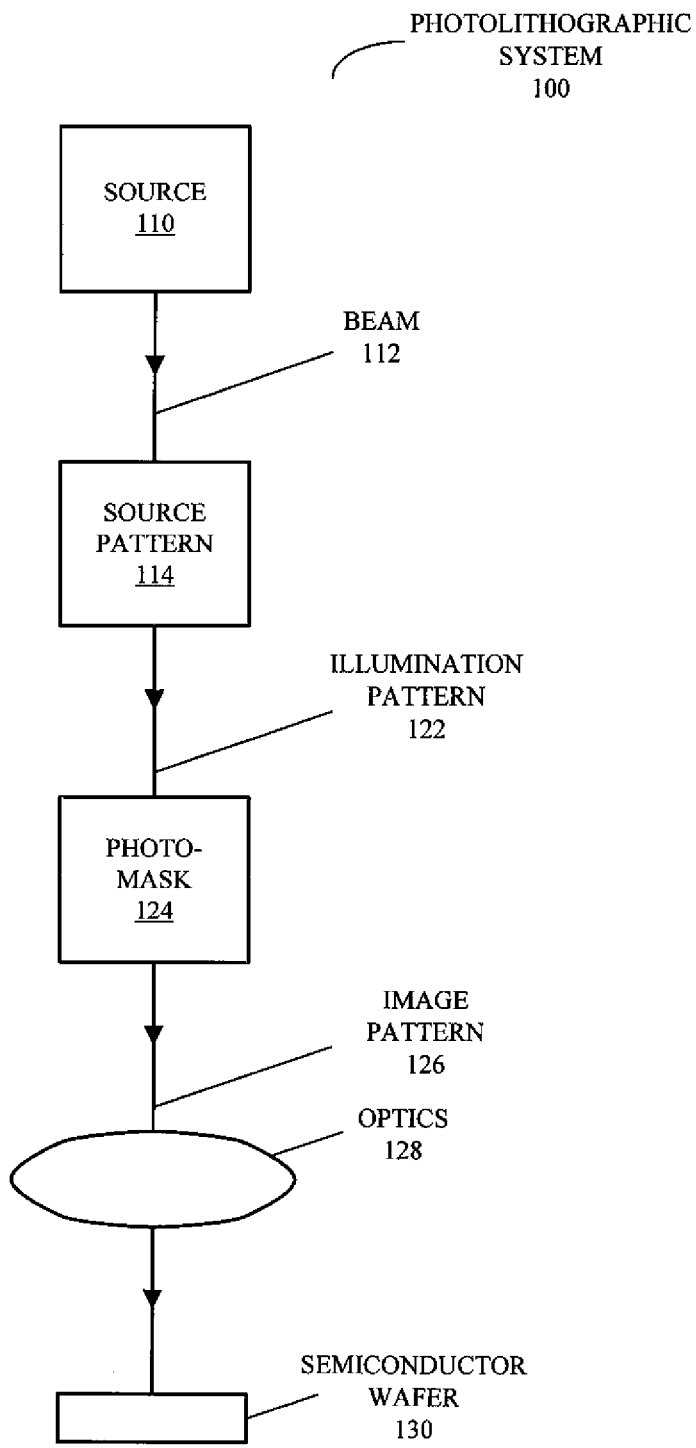
FIG. 1A is a block diagram illustrating a photolithographic system in accordance with an embodiment of the present invention.

We now describe embodiments of a system and a technique for determining a source pattern to illuminate a photo-mask during a photolithographic process. FIG. 1A presents a block diagram illustrating a photolithographic system 100, which may be used to image a target pattern onto a semiconductor wafer 130 during a photolithographic process. This photolithographic system includes a source 110 that provides a beam 112, which is modified by source pattern 114 to provide an illumination pattern 122. This illumination pattern is directed to a photo-mask 124 (which corresponds to a mask pattern). Photo-mask 124 modifies the illumination pattern to produce image pattern 126. Then, image pattern 126 is directed to optics 128 (which may de-magnify image pattern 126 by a factor of 100 or more) prior to exposing at least a portion of semiconductor wafer 130. After this exposure (or one or more additional exposures), the latent imaged or printed patterns on semiconductor wafer 130 may be developed. For example, a photo-resist layer on a surface of the semiconductor wafer 130 may be processed.

Source 110 may represent a wide variety of sources, including: one or more lamps (such as I line, g line, a wavelength of 193 nm, a wavelength of 248 nm, immersion, and/or any other optical lithography wavelength in air, water, or another fluid or gas), a laser and/or an electron-beam source. Moreover, source pattern 114 may modify the spatial intensity distribution (shape, size and/or magnitude) and/or polarization (phase) of one or more portions of beam 112. The combination of source 110 and source pattern 114 may be configured to provide: off-axis illumination, dipole illumination, quadrupole illumination, quasar illumination, incoherent illumination, coherent illumination and/or an arbitrary illumination pattern. Several examples of source patterns, such as source pattern 114, are provided below with reference to FIGS. 5A, 5C, 5E, 5G and 5I.

Furthermore, photo-mask 124 may be one of a variety of photo-masks, including: binary photo-mask (such as chrome on glass), a continuous-tone photo-mask, a phase-shifting photo-mask, an attenuated phase-shifting photo-mask, and/or a polarizing photo-mask. The target pattern may represent a layer in an integrated circuit. Additionally, the source pattern 114 and/or the photo-mask 124 may include a pixel-based format (i.e., spatially discrete data patterns), such as bitmap and/or grayscale patterns. In some embodiments, photo-mask 124 provides an aperture in photolithographic system 100. For example, this aperture may be placed at a focal plane in photolithographic system 100. Moreover, the aperture may modify the cone angle of a bundle of rays that come to a focus in an image plane in photolithographic system 100.

Note that source pattern 114 provides additional design degrees of freedom in photolithographic system 100, which may make it easier to: design the mask pattern for photo-mask 124, manufacture photo-mask 124, and/or to fabricate the target pattern on semiconductor wafer 130. In the discussion that follows, embodiments of a technique for determining source pattern 114 (separately or concurrently with the mask pattern for photo-mask 124) are described. This technique may significantly reduce the complexity in determining source pattern 114 and/or the mask pattern for photo-mask 124, thereby facilitating the use of the additional design degrees of freedom to improve photolithographic processes. In an exemplary embodiment, the technique includes an ILT calculation, in which a difference between an output at an image plane in photolithographic system 100 and a desired pattern (such as the target pattern) is used to determine an input at an object plane (and, thus, source pattern 114 and/or the mask pattern for photo-mask 124).

Figure 1B:
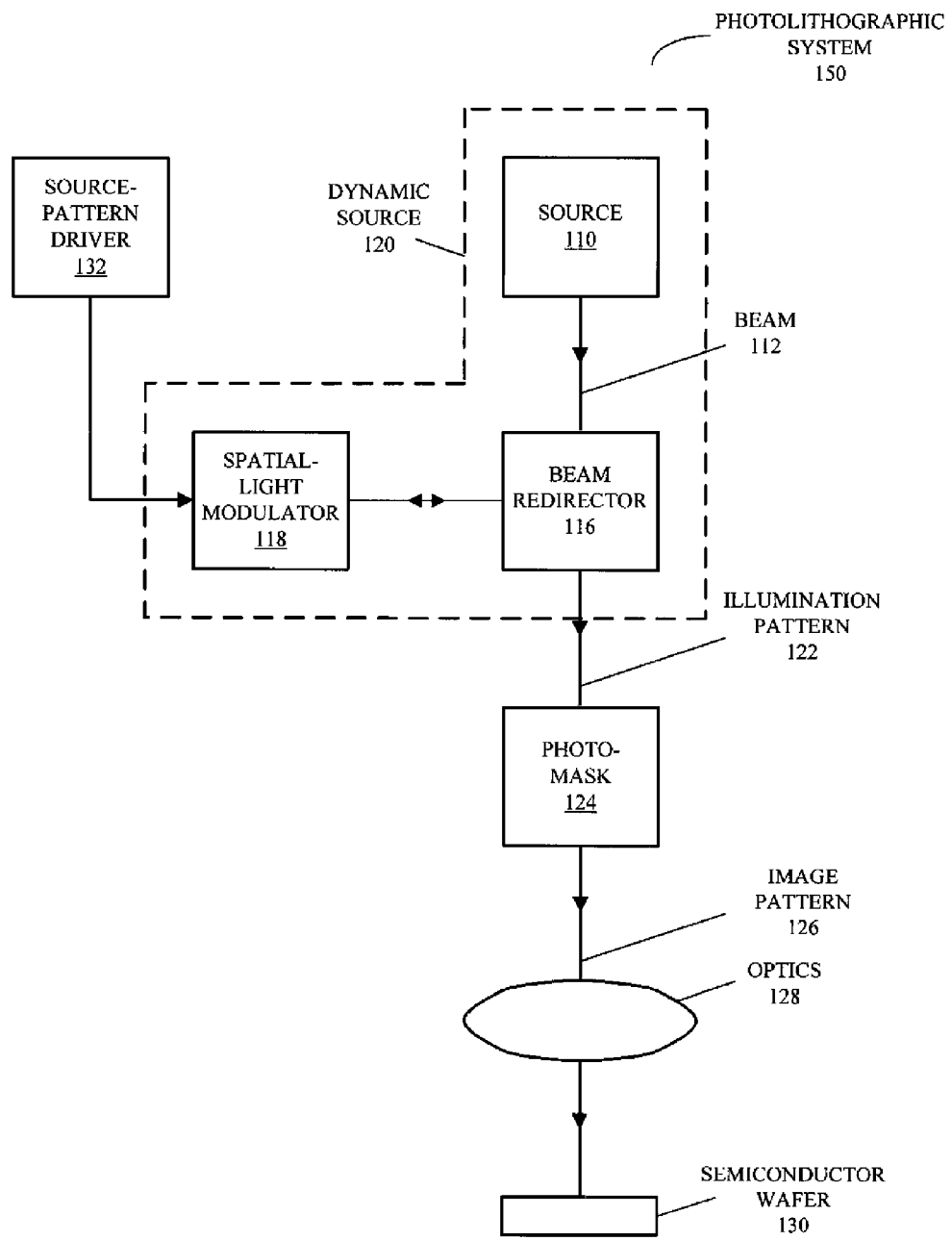
FIG. 1B is a block diagram illustrating a photolithographic system in accordance with an embodiment of the present invention.

In some embodiments, source pattern 114 can be dynamically adjusted between exposures of one or more semiconductor wafers, such as semiconductor wafer 130. This is shown in FIG. 1B, which presents a block diagram illustrating a photolithographic system 150. In this photolithographic system, dynamic source 120 is configured to provide illumination pattern 122. In particular, a given source pattern may be used to modify the spatial intensity distribution and/or polarization of beam 112 from source 110. For example, beam 112 may be directed by a beam redirector 116 (which may include a beam splitter) to a spatial-light modulator 118 that implements the given source pattern based at least on signals provided by source-pattern driver 132. This spatial-light modulator may modify a shape, a size and/or polarizations of portions of beam 112 to produce an illumination pattern 122, which then passes through the rest of the optical path as described previously for photolithographic system 100 (FIG. 1A).

Dynamic source 120 may be electronically configurable, for example, in less than 100 ms or 1 s. For example, settings of elements in the spatial-light modulator 118 may be configured based at least on the given source pattern. This source pattern may be used during one or more exposures of at least the portion of semiconductor wafer 130 during the photolithographic process.

Note that in some embodiments photolithographic systems 100 (FIG. 1A) and 150 include fewer or additional components. For example, in photolithographic system 150, photo-mask 124 may be implemented using another beam director in conjunction with another spatial-light modulator. Moreover, two or more components may be combined into a single component, and/or a position of one or more components may be changed.

FIG. 2A presents a flow chart illustrating a process 200 for determining a source pattern to illuminate a photo-mask during a photolithographic process, which may be performed by a computer system. During operation, the computer system determines a first function corresponding to a first source pattern (210), where a cardinality of the first function is greater than a number of distinct types of regions in the source pattern, and where the domain of the first function corresponds to a first plane of the first source pattern. Then, the computer system generates a second function based, at least in part, on the first function, where the second function corresponds to a second source pattern (212).

The first function and/or the second function may include a level-set function that includes multiple values or dimensions to represent a source pattern while it is being generated or calculated (such as during an ILT calculation). For example, the level-set function may have three or more values (the cardinality) and a given source pattern (which may have two or more values) may be obtained by evaluating the level-set function in a plane. Moreover, the domain (or input values) of the level-set function may correspond to the given source pattern. In some embodiments, the level-set function has three or more dimensions, and the given source pattern may to the value of the level-set function in a plane (such as that corresponding to z equal to zero in Cartesian coordinates) in this hyper-geometric space.

More generally, the number of values or cardinality of the level-set function may exceed the number of distinct regions in the given source pattern. Depending on the type of source pattern being represented, there may be two or more distinct regions in the given source pattern, which modify intensity or polarization of the beam 112 (FIGS. 1A and 1B). For example, the distinct types of regions of the given source pattern may include at least one translucent region and/or at least one polarized region.

In some embodiments, there are boundaries or contours between the distinct types of regions in the given source pattern. These contours may be used to re-express the first function and/or the second function as a distance function. In particular, the values of the first function and/or the second function may depend on the distance from a nearest contour in the plane of the given source pattern during the generating (or optimization) of the source pattern. In some embodiments, after operation 212, a re-distancing operation may be applied to the second function so that it is a distance function of contours between distinct types of regions in the second source pattern.

During the generating of the source pattern for use in a photolithographic process, the source pattern may be iteratively modified. For example, the generating may involve determining a gradient of a cost function, such as the different between an areal image at a semiconductor wafer and a desired target pattern. This process is shown in FIG. 2B, which presents a flow chart illustrating a process 250 for determining a source pattern to illuminate a photo-mask during a photolithographic process. Note that process 250 may be performed by a computer system. During operation, the computer system determines a third function corresponding to the first source pattern (260). Then, the computer system generates a fourth function based at least on the gradient of a cost function (262), where the fourth function corresponds to the second source pattern, and where the cost function corresponds to the first function.

The gradient may be the (full) derivative of the cost function (as opposed to a partial derivative or an approximation to the derivative). For example, the gradient may correspond to a Frechet derivative of the cost function and/or the gradient may be a closed-form expression. Thus, the gradient may be evaluated without performing multiple (iterative) calculations. In some embodiments, the gradient is determined without calculating the cost function. For example, if a closed-form expression is used, the dependence of the gradient on the cost function may be predetermined, which obviates the need to calculate the cost function as the source pattern is modified.

As noted previously, the cost function may correspond to a difference an aerial image at an image plane of an optical system in the photolithographic process and a target pattern (such as a circuit pattern that is to be printed at the image plane). This aerial image may be associated with the third source pattern and a mask pattern corresponding to a photo-mask. For example, the cost function may include a 2-norm of the difference. Alternatively, in another embodiment, the cost function corresponds to the difference of an estimated written pattern at the image plane (after the photo-resist is developed) and the target pattern.

Note that during process 250, the source pattern may be represented using one or more level-set functions, or may be represented in pixel-based format, such as bitmap and/or grayscale patterns. Therefore, the third function may be the first function, and the fourth function may be the second function.

In some embodiments, the computer system determines the mask pattern corresponding to the photo-mask concurrently with the source pattern. However, in some embodiments the computer system determines the mask pattern corresponding to the photo-mask separately from the source pattern. For example, the source pattern may be determined while the mask pattern is fixed, and vice versa. Moreover, this alternating modification or optimization may be iterated, until the resulting source pattern, mask pattern, and/or aerial image converges on a desired solution (for example, based at least on the resolution, contrast, intensity, depth of focus, and/or artifacts in the resulting photolithographic process).

The additional degrees of freedom provided by adapting or modifying the source pattern as well as the mask pattern may make it easier to design or fabricate the photo-mask. It may also improve the photolithographic processes. For example, the source pattern resulting from processes 200 (FIG. 2A) and/or 250 may improve a process window during the photolithographic process relative to that associated with the first source pattern (i.e., an initial source pattern).

In some embodiments of processes 200 (FIG. 2A) and/or 250 there are additional or fewer operations. Moreover, the order of the operations may be changed and/or two or more operations may be combined into a single operation.

Figure 3:
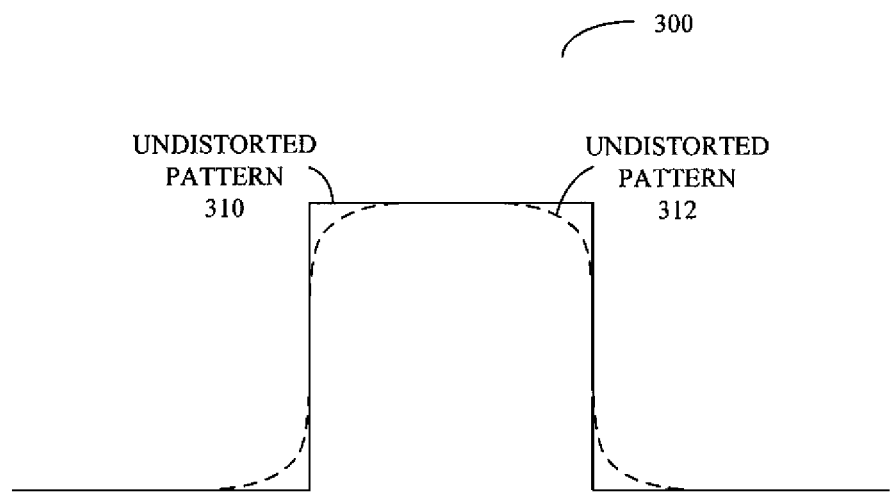
FIG. 3 is a drawing illustrating an undistorted pattern and a distorted pattern in accordance with an embodiment of the present invention.

The target pattern used to determine the cost function (and, thus, the source pattern) may be a distorted version of the desired circuit pattern. For example, the circuit pattern corresponding to a circuit design (such as that associated with a GDSII format) may be distorted by convolution with a Gaussian function prior to generating the source pattern. (Alternatively, the target pattern may be filtered prior to generating the source pattern.) This is shown in FIG. 3, which presents a drawing 300 illustrating an undistorted pattern 310 and a distorted pattern 312. This distorted pattern may be a better approximation to the aerial image that is produced during the photolithographic process due to the optical low-pass filter in the optical system. For example, the distortion may smooth out features that are smaller than 20% of the critical dimension in the photolithographic process.

In some embodiments, the computer system determines the first (or initial) source pattern on a pixel-by-pixel basis based at least on one or more metrics associated with the photolithographic process prior to determining the first function. For example, a given metric may include a contrast of a gradient of the aerial image or printed image at the image plane of the optical system in the photolithographic process. This aerial image or printed image may be associated with a given pixel in the first source pattern and the mask pattern corresponding to the photo-mask. In other embodiments, the metric(s) can include: contrast, image log slope, depth of focus, and/or process-variation bands (or process window).

Figure 4:
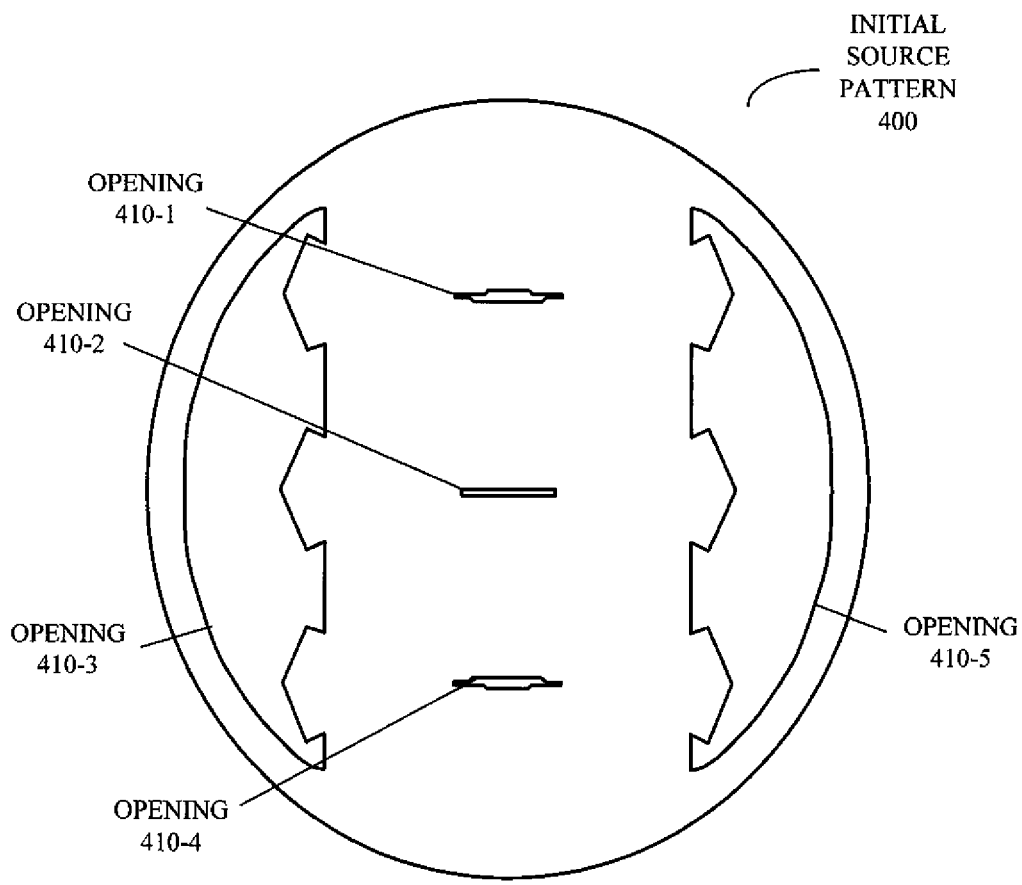
FIG. 4 is a drawing illustrating an initial source pattern in accordance with an embodiment of the present invention.

Moreover, determining the first source pattern may involve comparing the metrics with a predetermined threshold, where a given pixel has a finite transmittance if the given metric associated with the given pixel exceeds the predetermined threshold. This is shown in FIG. 4, which presents a drawing illustrating an initial source pattern 400. In this embodiment, pixels in source pattern 400 are turn on or off to define openings 410 based on the average of the contrast of the gradient of the aerial image. For example, pixels that exceed 100 or 150% of the average may be turned on (i.e., made transparent or translucent). Note that there may be interactions between pixels, so in some embodiments the computer system iteratively refines the determined first source pattern (until it converges) prior to processes 200 (FIG. 2A) and/or 250.

We now describe several embodiments of source patterns that were determined for target patterns using processes 200 (FIG. 2A) and/or 250 (FIG. 2B) in an ILT calculation. In these examples, the light source was monochromatic with a wavelength of 193 nm. Furthermore, during a first iteration the mask pattern used to define the photo-mask was initially the same as the target pattern while an estimate of the source pattern was determined. Then, during the next 50-100 iterations, the source pattern determined in the first iteration was fixed and the mask pattern was evolved. Next, during the next 50-100 iterations, the mask pattern was fixed and the source pattern was evolved. Typically, a simulation included at least 2-3 cycles with alternating evolution of the source pattern and the mask pattern. In some embodiments, during the first iteration intensity contrast was used to define the cost function. During subsequent iterations, other design features were used, such as: resolution, intensity, intensity contrast, and/or error metrics (for example, the depth of focus, the mask error enhancement function, and/or a process window).

Figure 5A:
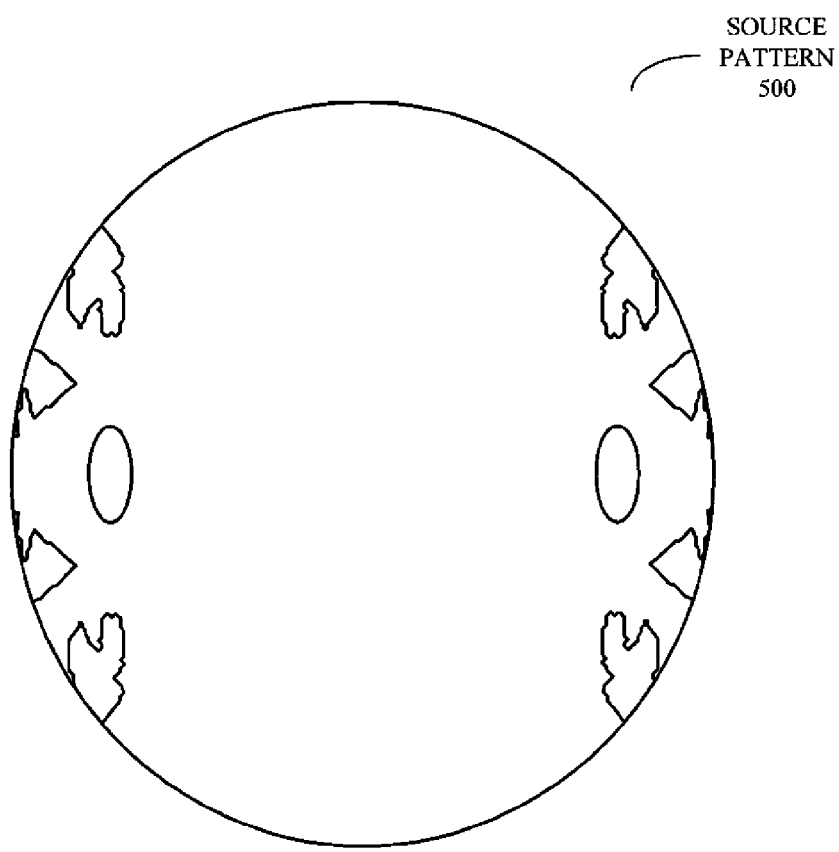
FIG. 5A is a drawing illustrating a source pattern in accordance with an embodiment of the present invention.
Figure 5B:
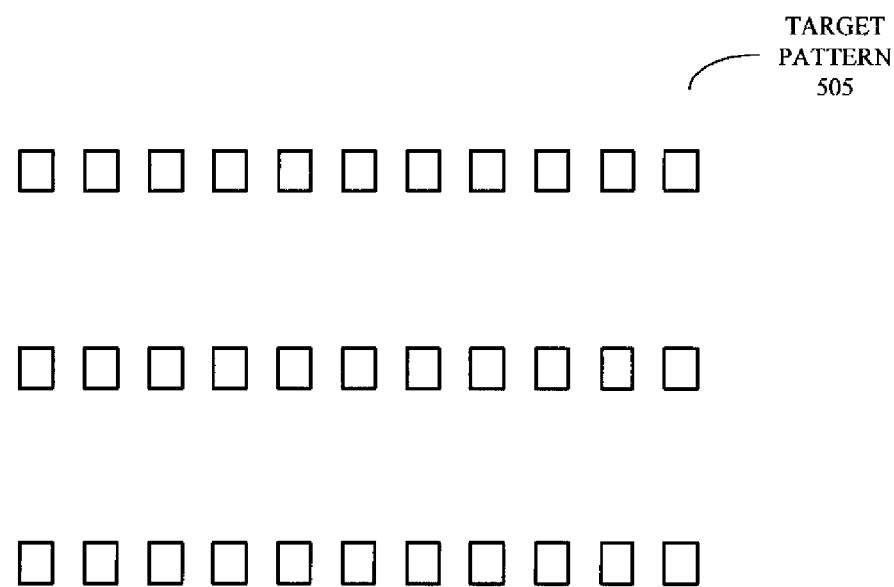
FIG. 5B is a drawing illustrating a target pattern in accordance with an embodiment of the present invention.

FIGS. 5A and 5B present drawings illustrating a chrome-on-glass source pattern 500 that corresponds to contact-array target pattern 505. Source pattern 500 was determined for a non-polarized light source with a chrome-on-glass photo-mask by optimizing the intensity contrast by adding and removing source pixels from an initial source pattern. Note that the vertical diamond-shaped features in source pattern 500 are openings. Approximations to these features (as well is features in the other source patterns described below) may be easier to manufacture. For example, a diamond-shaped feature may be approximated by a circle.

Figure 5C:
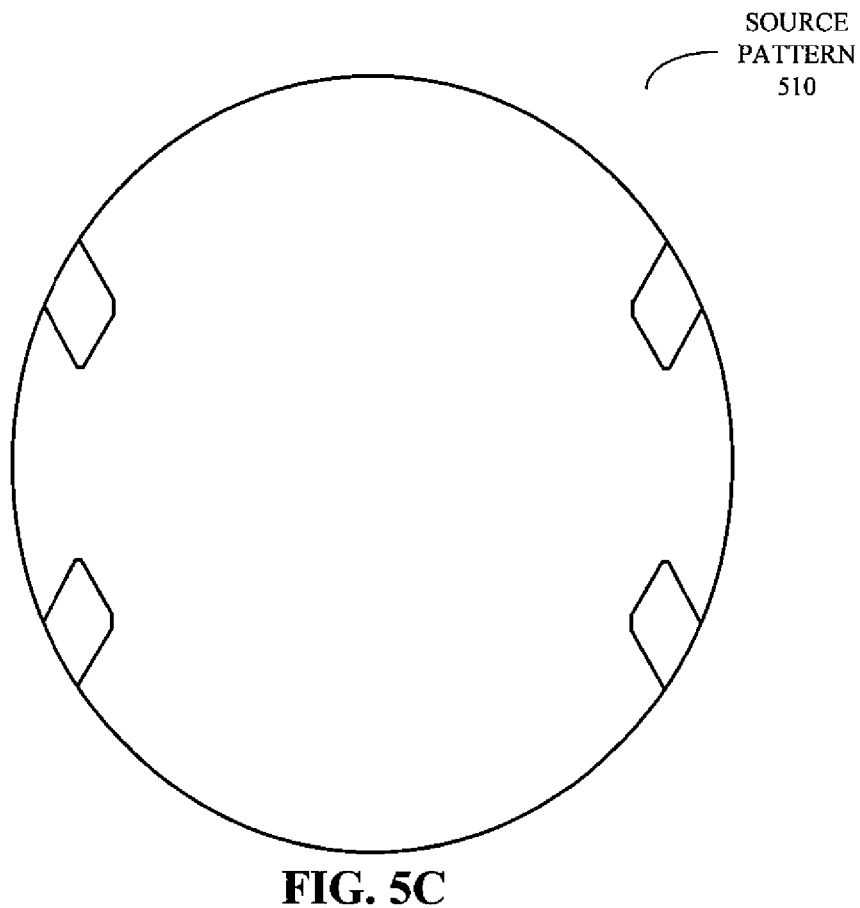
FIG. 5C is a drawing illustrating a source pattern in accordance with an embodiment of the present invention.
Figure 5D:
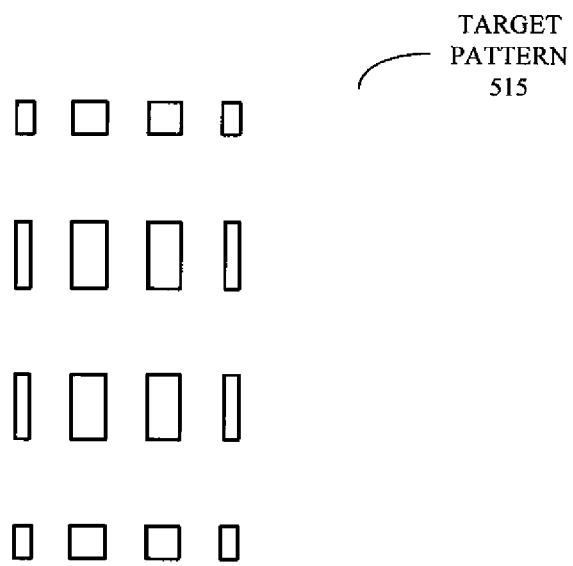
FIG. 5D is a drawing illustrating a target pattern in accordance with an embodiment of the present invention.

FIGS. 5C and 5D present drawings illustrating an attenuated source pattern 510 (which had a phase of 180° and a transmission of 0.06) that corresponds to contact-array target pattern 515. Source pattern 510 was determined for a polarized light source (which was polarized along the vertical direction in FIGS. 5C and 5D) with an attenuated photo-mask (which had a phase of 180° and a transmission of 0.06) by optimizing the intensity contrast by adding and removing source pixels from an initial source pattern.

Figure 5E:
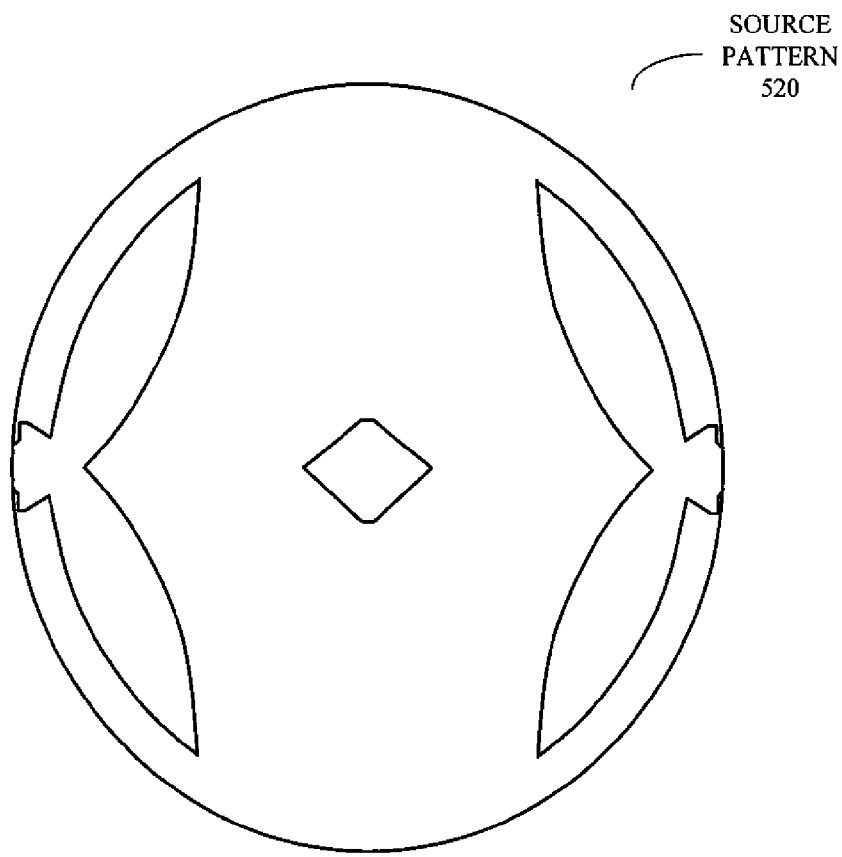
FIG. 5E is a drawing illustrating a source pattern in accordance with an embodiment of the present invention.
Figure 5F:
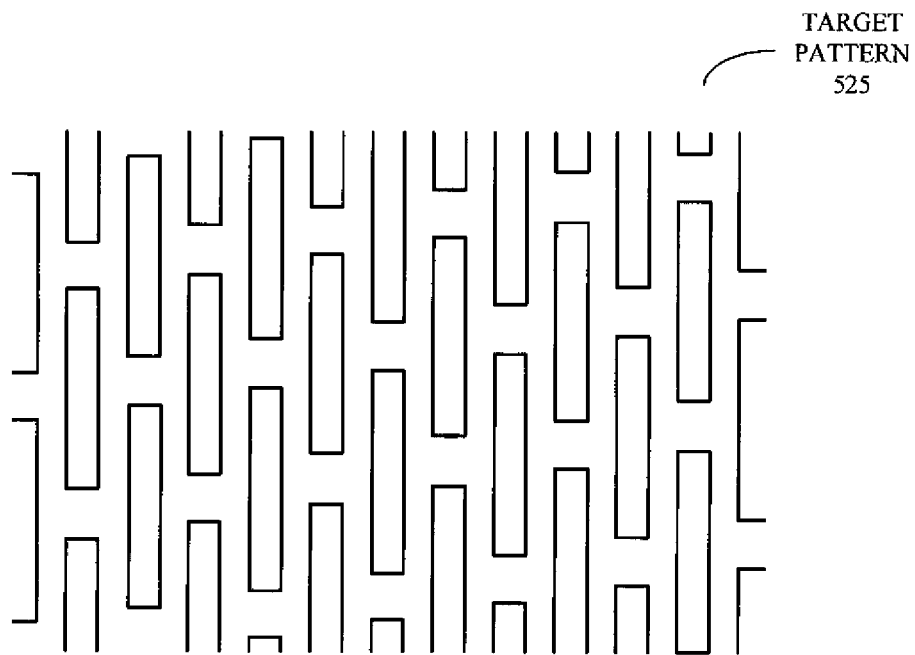
FIG. 5F is a drawing illustrating a target pattern in accordance with an embodiment of the present invention.

FIGS. 5E and 5F present drawings illustrating an attenuated source pattern 520 (which had a phase of 180° and a transmission of 0.06) that corresponds to target pattern 525. Source pattern 520 was determined for a TE-polarized light source with an attenuated photo-mask (which had a phase of 180° and a transmission of 0.06) by optimizing the gradient of the intensity by adding source pixels to an initial source pattern. Note that source pattern 520 has a central feature and butterfly-shaped features (which each has four-fold symmetry).

FIGS. 5G and 5H present drawings illustrating a chrome-on-glass source pattern 530 that corresponds to contact-array target pattern 535. Source pattern 530 was determined for a non-polarized light source with a chrome-on-glass photo-mask by optimizing the gradient of the intensity by adding source pixels from an initial source pattern. Note that source pattern 530 includes a dipole feature and a quadrupole feature.

Figure 5I:
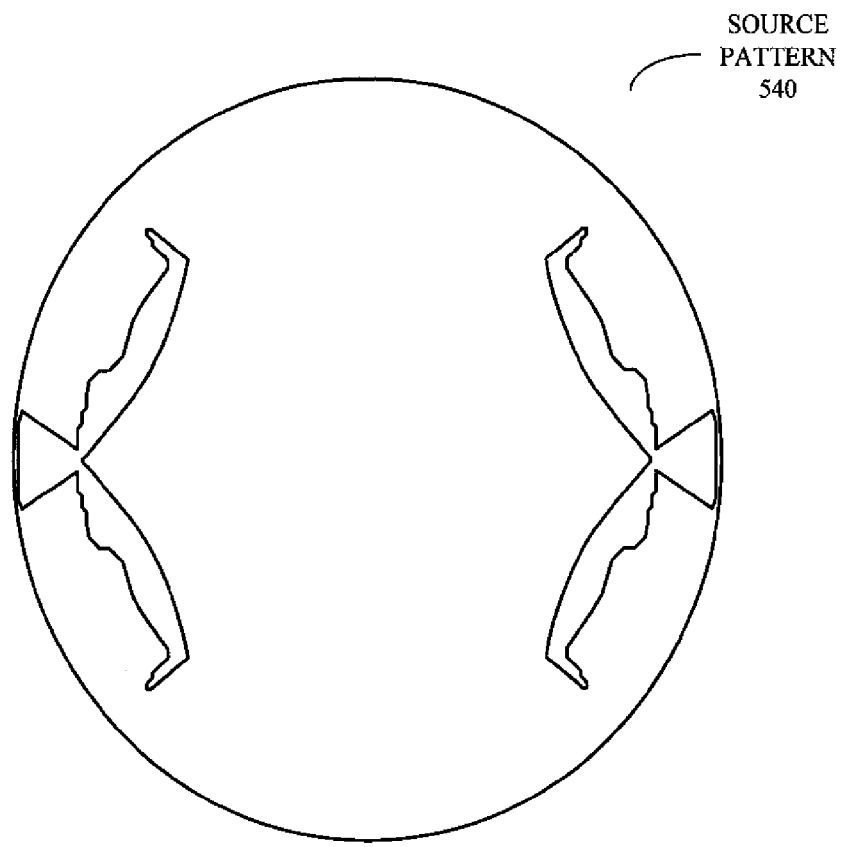
FIG. 5I is a drawing illustrating a source pattern in accordance with an embodiment of the present invention.
Figure 5J:
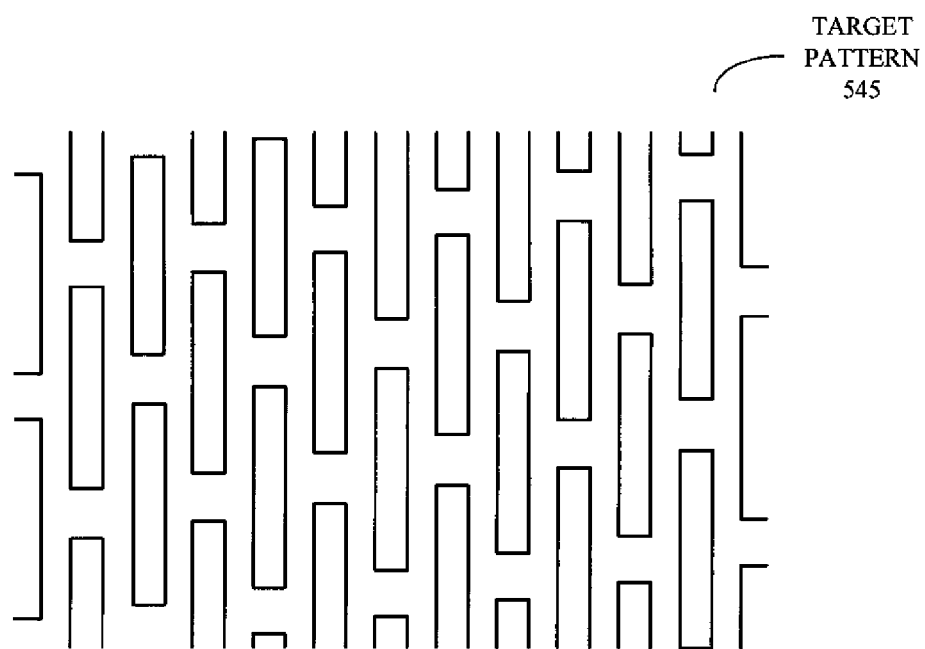
FIG. 5J is a drawing illustrating a target pattern in accordance with an embodiment of the present invention.

FIGS. 5I and 5J present drawings illustrating an attenuated source pattern 540 (which had a phase of 180° and a transmission of 0.06) that corresponds to target pattern 545. Source pattern 540 was determined for an XY-polarized light source with an attenuated photo-mask (which had a phase of 180° and a transmission of 0.06) by optimizing the gradient of the intensity by adding and removing source pixels from an initial source pattern.

We now describe embodiments of the calculations or computations that are performed when determining one or more source patterns and/or one or more mask patterns. In some embodiments, these calculations include an inverse calculation in which an acceptable aerial image or wafer pattern at an image plane of the optical system (relative to the target pattern) is used to determine a given intensity pattern at an object plane (such as that associated with the forward projection of a given source pattern and/or a given mask pattern at the object plane). For example, the inverse calculations may include an inverse lithography (ILT) calculation. However, in some embodiments the calculation includes an image-based optical proximity correction. Moreover, in some embodiments the calculations include determining an estimated wafer pattern using a model of the lithographic process. This model may include a photo-resist model of a photo-resist used in the photolithographic process.

Furthermore, in some embodiments of the iterative calculation, a gradient of a merit or error function H (which is dependent upon or is a function of the difference between the target pattern and the estimated aerial image or printed image, and thus is dependent on the given source pattern and/or the given mask pattern) may be determined. Note that the gradient may be calculated based at least on a formula obtained by taking the derivative of the merit or error function H. This gradient may be used to determine the source pattern and/or a mask pattern in an iterative calculation, such as a steepest-descent gradient-flow calculation.

In some embodiments, the inverse calculation may be based at least on minimization of the error function (which is also sometimes referred to as a cost function or a Hamiltonian function). During each iteration of the calculation, the error function may be a function of the difference between the estimated aerial image or printed image that results when an image associated with the given source pattern and/or the given mask pattern is projected through the optical path in the optical system during the photolithographic process. In some embodiments, multiple aerial images may be used, such as those corresponding to a range of process conditions or multiple exposures.

A forward calculation may also be used when determining the error function. In the discussion that follows, coherent illumination by an illumination pattern associated with the source (and source pattern) in the photolithographic process is assumed for purposes of illustration. Furthermore, the electric field falling on the fabricated source pattern (which corresponds to the source pattern determined using processes 200 in FIG. 2A and/or 250 in FIG. 2B), as well as on the photo-mask (which is associated with the given mask pattern), is approximately constant. Using photolithography as an example, note that some regions of the given source pattern (such as those corresponding to '0s' in a binary source pattern) reflect (such as with a source pattern for use with light having wavelengths in the extreme ultraviolet) or transmit the light to the semiconductor wafer at the image plane of the optical system, while other regions (such as those corresponding to '1s' in the binary source pattern) do not reflect or transmit the light to the semiconductor wafer. It follows that a scalar electric field E after reflection off of or transmission through the given source pattern (which is henceforth referred to as an image pattern), may be expressed as $$E(\vec{r}) = \begin{Bmatrix} 0 \\ 1 \end{Bmatrix},$$

where $\vec{r}=(x, y)$ is a point on the (x,y) plane. (More generally, the electric field may include grayscale values in the range $\{-1, 1\}$ or arbitrary complex numbers that correspond to the features of the given source pattern. Thus, source patterns fabricated using chrome-on-glass and various materials other than chrome on glass, such as attenuated phase-shifting, strong phase-shifting, and/or polarizing materials are within the scope of the present invention.) Note that this representation of the source pattern may be re-expressed using a function $\phi_s$ (referred to as a source-pattern level-set function) having negative regions that indicate light reflected or transmitted to the semiconductor wafer (pixels 'on') and positive regions that indicate an absence of light reflected or transmitted to the semiconductor wafer (pixels 'off'). (More generally, the level-set function may have two or more levels and the given source pattern may be represented by one or more level-set functions.) Furthermore, the level-set function may equal zero at the boundaries or contours of features of the given source pattern. Therefore, the electric field $E_s$ associated with the given source pattern may be re-expressed as a function of this level-set function, i.e., $$E_s(\vec{r})=\hat{h}(\phi_s(x,y)),$$

where $\hat{h}$ is a transmission or reflection function $$\hat{h}(x) = \begin{Bmatrix} 0 & x \geq 0 \\ 1 & x < 0 \end{Bmatrix}.$$

(Note that in some embodiments the source-pattern level-set function can be grayscale, i.e., transmission or reflection function $\hat{h}$ (for $E_s$) can have a smooth transition region between 0 and 1.) Similarly, the electric field $E_m$ associated with the photo-mask corresponding to the given mask pattern may be expressed as a function of a mask-pattern level-set function $\phi_m$.

Since an ideal diffraction limited lens acts as a low-pass filter, this may be used as an approximation to the actual (almost but not quite perfect) optics in the optical path in the optical system. Mathematically, the action of a lens may be expressed as $$A(\vec{r})=f^{-1}(\hat{C}(f(E_m(\vec{r})\cdot E_s(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture (NA) of the lens, and one otherwise. Thus, the pupil function is $$\hat{C}(k_x, k_y) = \hat{h}(k_{max}^2 - [k_x^2 + k_y^2]) = \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$ and $k_{max}$ represent frequency coordinates in Fourier space. Therefore, the intensity pattern on the semiconductor wafer is simply the square of the electric field $$I(\vec{r})=|A(\vec{r})|^2.$$

Combining these two equations, we find $$I(\phi_m(x',y'),\phi_s(x,y))=(|f^{-1}(\hat{C}(f(\hat{h}(\phi_m(x',y'))\cdot\hat{h}(\phi_s(x,y)))))|^2).$$

This is a self-contained formula for the intensity pattern at the semiconductor wafer based on the source pattern and the photo-mask.

Note that this is just one embodiment of the forward calculation that can be used within the scope of this invention, chosen by way of example due to its relative simplicity. More sophisticated forward models also fall within the scope of the present invention. Such models may take into account, by way of example but not limitation, various illumination conditions (e.g., off-axis, incoherent), the actual electromagnetics of the light field interacting with the given source pattern and/or the given photo-mask, the polarization of the light field, the actual properties of the lens (such as aberrations), and/or the vector nature of the electromagnetic field as it propagates through the optical path in the optical system during the photolithographic process.

In some embodiments, during each iteration of the inverse calculation the level-set function corresponding to the given source pattern and/or the given mask pattern is updated according to $$\phi_{i+1}=\phi_i+\Delta\phi=\phi_i+\Delta t\cdot\nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the error function. Note that $\nabla(H)$ is $$\left.\frac{\delta H}{\delta \phi}\right|_{\varphi_i},$$

i.e., it is the Frechet derivative of the error function H. Furthermore, in some embodiments $\nabla(H)$ is the direction of steepest descent for minimizing or optimizing H by changing $\phi$. Moreover, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse calculation. In particular, the error function H may be allowed to increase during some iterations as the calculation evolves. In this way, the global minimum in the multi-dimensional space may be determined. Note that the size of this multi-dimensional space is proportional to a number of quantization levels to the power of the number of pixels in the given source pattern and/or the given mask pattern. In an exemplary embodiment, these patterns or images have at least 1 million pixels (for example, 1024×1024).

In some embodiments, the inverse calculation is run for 100, 1000 or 10,000 iterations at which point the optimal solution has been determined. In other embodiments, the calculation is stopped based at least on convergence criteria, such as: oscillatory behavior, a relative and/or absolute difference between the aerial image and the target pattern (or the estimated wafer pattern and the target pattern), the latest change to the error function H, and/or the history of changes to the error function H. For example, the relative difference may be less than 1% and/or the absolute difference may be 10 nm for a critical dimension of 100 nm.

In some embodiments, the inverse calculation is divided into a series of overlapping work units, at least some of which are processed independently and/or concurrently by a group of processors and/or processor cores. These work units may be based at least on features or structures (for example, repetitive structures) in the given source pattern and/or the given mask pattern.

Note that the group of processors and/or processor cores may be distributed over multiple computers or servers, and may also be dispersed over multiple locations. In addition, computations may be implemented in computers or servers that are coupled via a network (such as the Internet and/or an intranet). After these work-unit calculations have been completed, the resulting sub-patterns may be combined to generate the given source pattern and/or the given mask pattern.

In some embodiments, prior to determining the given source pattern and/or the given mask pattern, the target pattern is converted from a first or initial format into a second format. For example, the initial format may be hierarchical and/or a polygon-type format, such as one compatible with GDSII, OASIS, and/or another polygon-type format. The second format may be a hierarchy with two levels, a top level and everything else (more generally, the second format may have fewer levels than the initial format). In such a hierarchy, the processing of a cell instance does not depend on the processing of any other cell instance. Thus, in theory all of the instances may be processed in parallel. Note that in some embodiments the initial format and/or the second format may include a pixel-based format, i.e., spatially discrete data patterns (such as bitmap and/or grayscale images), binary patterns, and/or continuous-tone patterns. Note that after the calculations have been completed, a format of the given source pattern and/or the given mask pattern may be converted back to the initial format.

Figure 6:
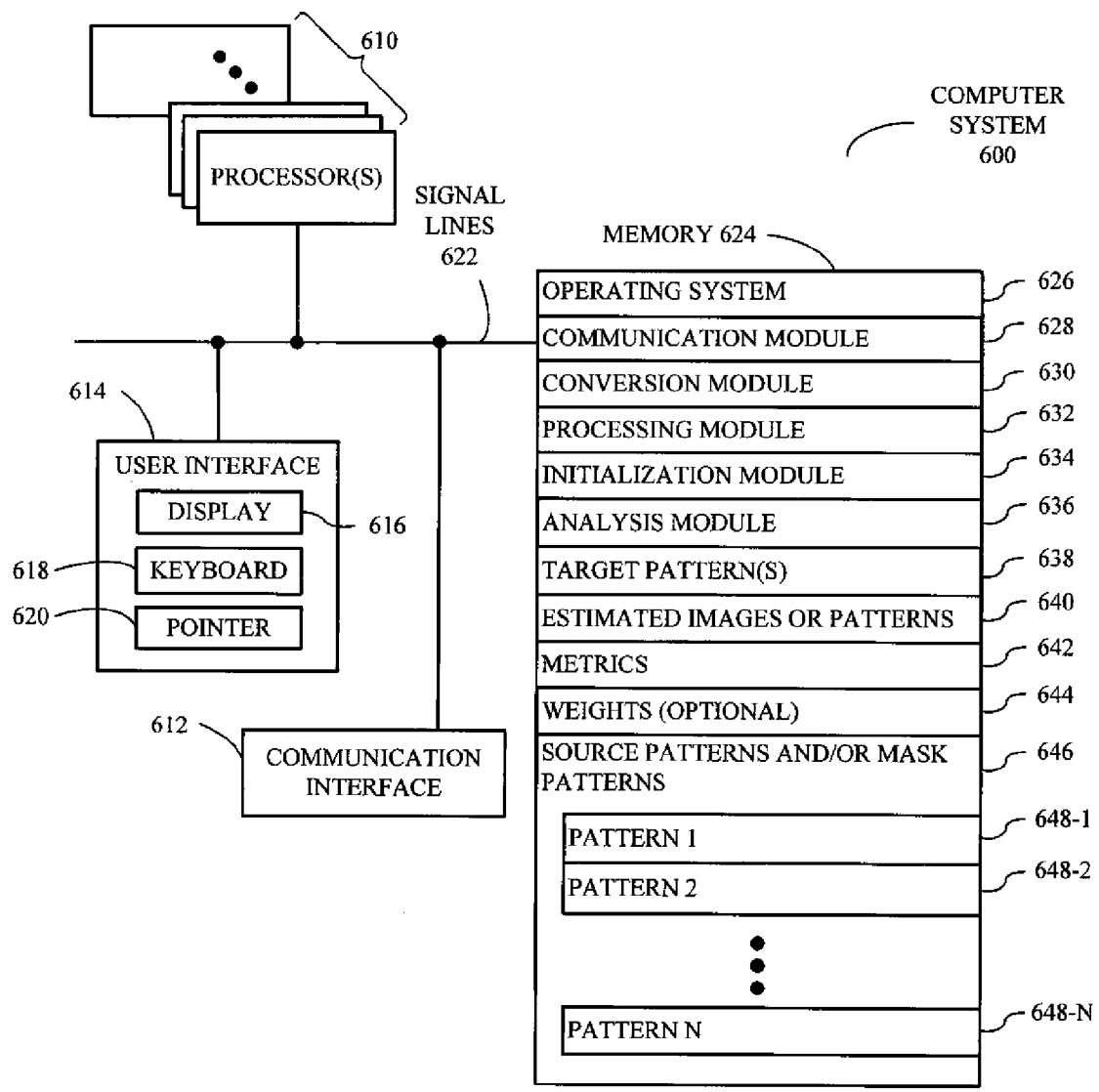
FIG. 6 is a block diagram illustrating a computer system to determine source patterns in accordance with an embodiment of the present invention.

We now describe embodiments of a computer system that determines the source patterns and/or the mask patterns. FIG. 6 presents a block diagram illustrating an embodiment of a computer system 600 to determine source patterns and/or mask patterns. Computer system 600 includes multiple processors 610 or processor cores, a communication interface 612, a user interface 614, and one or more signal lines 622 coupling these components together. Note that the processing units 610 support parallel processing and/or multi-threaded operation, the communication interface 612 may have a persistent communication connection, and the one or more signal lines 622 may constitute a communication bus. Moreover, the user interface 614 may include: a display 616, a keyboard 618, and/or a pointer 620, such as a mouse.

Memory 624 in the computer system 600 may include volatile memory and/or non-volatile memory. More specifically, memory 624 may include: ROM, RAM, EPROM, EEPROM, flash memory, one or more smart cards, one or more magnetic disc storage devices, and/or one or more optical storage devices. Memory 624 may store an operating system 626 that includes procedures (or a set of instructions) for handling various basic system services for performing hardware dependent tasks. The memory 624 may also store communications procedures (or a set of instructions) in a communication module 628. The communication procedures may be used for communicating with one or more computers, devices and/or servers, including computers, devices and/or servers that are remotely located with respect to the computer system 600.

Memory 624 may also include one or more program modules (or sets of instructions), including: conversion module 630 (or a set of instructions), processing module 632 (or a set of instructions), initialization module 634 (or a set of instructions) and/or analysis module 636 (or a set of instructions). Moreover, one or more of these program modules may constitute a computer-program mechanism.

Conversion module 630 may convert an initial file format to a format suitable for processing. For example, one or more target pattern 638 may be converted to a different format, such as bitmap or grayscale. Then, processing module 632 may divide the analysis up into overlapping work units, at least some of which can be processed in parallel by processors 610.

Initialization module 634 may determine initial source patterns and/or mask patterns 646, such as one or more of patterns 648, based at least on estimated images or patterns 640 (at an image plane in an optical system) and/or one or more metrics 642. These estimated images or patterns 640 may be determined by analysis module 636 using a model of an optical path and/or a photo-resist, as well as process conditions in a photolithographic process.

Then, analysis module 636 generates source patterns and/or mask patterns 646 using an iterative process, such as the ILT calculation. This process may include representing the source patterns and/or mask patterns 646 using one or more level-set functions and/or revising a previous estimate based at least on the gradient of a cost function. In some embodiments, the one or more level-set functions are distance functions. Thus, analysis module 636 may perform a re-distancing operation after one or more iterations of the iterative process.

As noted previously, a given source pattern and the related given mask pattern may be generated concurrently or sequentially. In some embodiments, the generating is based at least on metrics 642, such as a resulting process window for the photolithographic process. Moreover, different parameters may be according different weighting based at least on optional weights 644 during the generating. After the generating, the results may be stored in source patterns and/or mask patterns 646.

Instructions in the various modules in the memory 624 may be implemented in: a high-level procedural language, an object-oriented programming language, and/or in an assembly or machine language. The programming language may be compiled or interpreted, i.e., configurable or configured, to be executed by the processing units 610.

Although the computer system 600 is illustrated as having a number of discrete components, FIG. 6 is intended to be a functional description of the various features that may be present in the computer system 600 rather than as a structural schematic of the embodiments described herein. In practice, and as recognized by those of ordinary skill in the art, the functions of the computer system 600 may be distributed over a large number of servers or computers, with various groups of the servers or computers performing particular subsets of the functions. In some embodiments, some or all of the functionality of the computer system 600 may be implemented in one or more application-specific integrated circuits (ASICs) and/or one or more digital signal processors (DSPs).

Note that computer system 600 may include fewer components or additional components. Moreover, two or more components may be combined into a single component and/or a position of one or more components may be changed. In some embodiments the functionality of computer system 600 may be implemented more in hardware and less in software, or less in hardware and more in software, as is known in the art.

We now describe embodiments of a data structure that may be used in the computer system 600. FIG. 7 presents a block diagram illustrating an embodiment of a data structure 700. This data structure may include patterns 710, such as source patterns and/or mask patterns. A given pattern, such as pattern 710-1, may include multiple pairs of positions 712 and associated values 714 in the pattern 710-1. Note that in some embodiments of the data structure 700 there may be fewer or additional components. Moreover, two or more components may be combined into a single component and/or a position of one or more components may be changed.

While the preceding discussion has used source patterns and mask patterns in photolithographic processes as illustrative examples, in other embodiments these techniques may be applied to determine source patterns and write patterns for use in a direct-write lithographic process (i.e., a maskless lithographic process).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A computer-implemented method for determining a source pattern to illuminate a photo-mask during a photolithographic process, comprising:
determining a first function representing a first source pattern, a cardinality of the first function, including values of the first function greater than a number of distinct types of regions in the source pattern, and a domain of the first function including input values of the first function corresponding to a first plane of the first source pattern;
using the computer, generating a second function based, at least in part, on the first function, the second function representing a second source pattern, the first function providing a representation of the first source pattern and the second function providing a representation of the second source pattern;
determining the second source pattern by evaluating the second function within a domain of the second function, the domain of the second function including input values of the second function; and
determining a resulting source pattern based on the determined second source pattern, the resulting source pattern placed between a light source and a photo-mask to illuminate the photo-mask in a photolithographic process.

2. The method of claim 1, wherein the number of distinct types of regions of the first source pattern is 2.

3. The method of claim 1, wherein the number of distinct types of regions of the first source pattern is greater than 2.

4. The method of claim 3, wherein the distinct types of regions of the first source pattern include at least one translucent region.

5. The method of claim 1, wherein the distinct types of regions of the first source pattern include at least one polarized region.

6. The method of claim 1, wherein the first function includes a level-set function.

7. The method of claim 1, wherein the first function is a distance function in which a value of the first function corresponds to a distance from a nearest contour in the first plane of the first source pattern; and
wherein the nearest contour separates a first distinct type of region in the source pattern from a second distinct type of region in the source pattern.

8. The method of claim 1, wherein the generating involves determining a gradient of a cost function.

9. The method of claim 8, wherein the gradient corresponds to a Frechet derivative of the cost function.

10. The method of claim 8, wherein the gradient is a closed-form expression.

11. The method of claim 8, wherein the gradient is determined without calculating the cost function.

12. The method of claim 8, wherein the cost function corresponds to a difference of a target pattern and an aerial image at an image plane of an optical system in the photolithographic process;
wherein the aerial image is associated with the first source pattern and a mask pattern corresponding to the photo-mask.

13. The method of claim 12, wherein the target pattern corresponds to a distorted version of a circuit pattern that is to be printed at the image plane.

14. The method of claim 13, wherein the distortion involves convolving a Gaussian function with the circuit pattern.

15. The method of claim 12, wherein the cost function includes a 2-norm of the difference.

16. The method of claim 1, further comprising calculating the second source pattern by evaluating the second function in a second plane, which can be the first plane.

17. The method of claim 1, further comprising determining a mask pattern corresponding to the photo-mask concurrently with determining of the source pattern.

18. The method of claim 1, further comprising determining a mask pattern corresponding to the photo-mask separately from determining of the source pattern.

19. The method of claim 1, further comprising determining the first source pattern on a pixel-by-pixel basis based at least on metrics associated with the photolithographic process prior to determining the first function.

20. The method of claim 19, wherein a given metric includes a contrast of a gradient of an aerial image at an image plane of an optical system in the photolithographic process;
wherein the aerial image is associated with a given pixel in the first source pattern and a mask pattern corresponding to the photo-mask.

21. The method of claim 20, wherein determining the first source pattern involves comparing the metrics with a predetermined threshold; and
wherein a given pixel has a finite transmittance if the given metric associated with the given pixel exceeds the predetermined threshold.

22. The method of claim 20, further comprising refining the determined first source pattern based at least on interactions between pixels.

23. A computer-program product for use in conjunction with a computer system, the computer-program product comprising a non-transitory computer-readable storage medium and a computer-program mechanism embedded therein for determining a source pattern to illuminate a photo-mask dur ing a photolithographic process, the computer-program mechanism including:

instructions for determining a first function representing a first source pattern, a cardinality of the first function including values of the first function greater than a number of distinct types of regions in the source pattern, and a domain of the first function including input values of the first function corresponding to a first plane of the first source pattern;

instructions for generating a second function based, at least in part, on the first function, the second function representing a second source pattern, the first function providing a representation of the first source pattern and the second function providing a representation of the second source pattern;

instructions for determining the second source pattern by evaluating the second function within a domain of the second function, the domain of the second function including input values of the second function; and instructions for determining a resulting source pattern based on the determined second source pattern, the resulting source pattern placed between a light source and a photo-mask to illuminate the photo-mask in a photolithographic process.

24. A computer system, comprising:

a processor;

a memory; and a program module for determining a source pattern to illuminate a photo-mask during a photolithographic process, the program module stored in the memory and configured to be executed by the processor, the program module including:

instructions for determining a first function representing a first source pattern, a cardinality of the first function, including values of the first function greater than a number of distinct types of regions in the source pattern, and a domain of the first function, including input values of the first function, corresponding to a first plane of the first source pattern; and instructions for generating a second function based, at least in part, on the first function, the second function representing a second source pattern, the first function providing a representation of the first source pattern and the second function providing a representation of the second source pattern;

instructions for determining the second source pattern by evaluating the second function within a domain of the second function, the domain of the second function including input values of the second function; and instructions for determining a resulting source pattern based on the determined second source pattern, the resulting source pattern placed between a light source and a photo-mask to illuminate the photo-mask in a photolithographic process.

25. The method of claim 1, wherein the resulting source pattern is the second source pattern.

* * * * *